(12) United States Patent
Ernst et al.

(10) Patent No.: US 6,865,707 B2
(45) Date of Patent: Mar. 8, 2005

(54) TEST DATA GENERATOR

(75) Inventors: Wolfgang Ernst, Munich (DE); Gunnar Krause, Munich (DE); Justus Kuhn, Munich (DE); Jens Luepke, Munich (DE); Jochen Mueller, Munich (DE); Peter Poechmueller, Colchester, VT (US); Michael Schittenhelm, Poing (DE)

(73) Assignee: Infineon Technologies AG, Munich (DE)

( * ) Notice: Subject to any disclaimer, the term of this patent is extended or adjusted under 35 U.S.C. 154(b) by 432 days.

(21) Appl. No.: 10/109,657

(22) Filed: Apr. 1, 2002

(65) Prior Publication Data

US 2002/0157052 A1 Oct. 24, 2002

(30) Foreign Application Priority Data

Mar. 30, 2001 (DE) ........................................ 101 15 879

(51) Int. Cl.[7] .......................... G01R 31/28; G06F 11/00
(52) U.S. Cl. ...................................... 714/744; 714/743
(58) Field of Search ................................. 714/744, 738, 714/739, 743, 728

(56) References Cited

U.S. PATENT DOCUMENTS

| 5,390,192 | A | | 2/1995 | Fujieda | |
|---|---|---|---|---|---|
| 5,640,509 | A | | 6/1997 | Balmer et al. | |
| 6,006,349 | A | * | 12/1999 | Fujisaki | ...................... 714/738 |
| 6,571,365 | B1 | * | 5/2003 | Rhodes et al. | .............. 714/738 |

* cited by examiner

*Primary Examiner*—Joseph D. Torres
(74) *Attorney, Agent, or Firm*—Greenblum & Bernstein, P.L.C.

(57) ABSTRACT

Test data generator for generating test data patterns for the testing of a circuit having a frequency multiplication circuit, which increases a low clock frequency of an input clock signal received by a test unit with a specific clock frequency multiplication factor. Also provided is a plurality of data registers for storing test data words read from the data registers, and multiplexer that switches through a test data word read from a data register with the high clock frequency of the output clock signal to a data bus in a way dependent on a register selection control datum of a multi-position register selection control data vector.

20 Claims, 4 Drawing Sheets

TEST DATA GENERATOR

The present invention relates to a test data generator for generating test data patterns for the testing of a clocked circuit.

DESCRIPTION OF THE RELATED ART

U.S. Pat. No. 5,640,509 describes an IC package comprising two integrated sub-circuits, namely a processor and a cache memory. In this case, the cache memory is composed inter alia of a memory array, a clock multiplier and a programmable self-test circuit. The programmable self-test circuit or test data generator contains, for its part, self-test registers to which test data can be written externally, for example by a slow test unit, via a serial path or via bus lines of a bus. The clock multiplier in the cache memory 14 increases the clock rate of the externally applied signals in the test mode.

U.S. Pat. No. 5,390,192 discloses a high-speed pattern generator for the testing of integrated circuits. The high-speed pattern generator comprises a control memory and individual pattern generators. A system clock is divided down in a frequency divider for controlling the control memory and the multiplexer, the multiplexer selecting a test pattern from the applied test patterns of the individual pattern generators and outputting it in a time division multiplex method at n-fold frequency.

After the fabrication process, integrated circuits, in particular memory modules, are subjected to a test operation in order to check their functionality. In this case, the circuit to be tested (DUT: Device Under Test) is connected to an external test unit.

FIG. 1 shows a test arrangement according to the prior art. The circuit to be tested is driven by the external test unit via a control bus and exchanges data with the test unit via a data bus. The test unit furthermore generates addresses for addressing the memory cells of the circuit DUT to be tested, which are applied via an address bus to the circuit to be tested. The memory cells are addressed and the test data are written to the various memory cells of the memory module via the data bus by the test unit. Afterward, the written-in data are read out again and received by the test unit; they are compared with the originally generated test data patterns in order to check the functionality of the various memory cells.

So-called synchronous memory modules operate with a specific operating frequency and are clocked by a clock signal. Modern memory modules operate at ever higher clock frequencies, which may be a few hundred megahertz. Conventional test units are unable to reliably test memory modules which are operated at such high clock frequencies. A further disadvantage of the fixed arrangement illustrated in FIG. 1 is that the lengths of the various lines of the control bus, of the data bus and of the address bus between the test unit and the memory module are relatively long, so that the high-frequency test signals are highly susceptible to interference.

Therefore, a feature of the present invention is to provide a test data generator for generating test data patterns with which circuits that are clocked at high frequency can be reliably tested using low-frequency conventional test units. This feature is achieved by a test data generator in accordance with the present invention.

The invention provides a test data generator for generating test data patterns for the testing of a circuit, having: a frequency multiplication circuit, which increases a low clock frequency of an input clock signal received by a test unit by a specific clock frequency multiplication factor in order to generate an output clock signal with a high clock frequency for the circuit to be tested; a plurality of data registers for storing a specific number of test data words which are read from the data registers; at least one multiplexer for switching through a test data word read from a data register and having the high clock frequency to a data bus in a manner dependent on a register selection control datum of a multi-row register selection control data vector, which is received by the test unit with the low clock frequency of the input clock signal, the number of register selection control data of the register selection control data vector being equal to the clock frequency multiplication factor and, during a clock period of the output clock signal, that test data word being switched through by the multiplexer in the case of a signal edge of the output clock signal which is specified by the register selection control datum in the associated row of the register selection data vector.

In an embodiment of the test data generator according to the invention, the test data generator can be changed over between a first operating mode for single data rate data generation and a second operating mode for double data rate data generation.

In this case, in the first operating mode, the test data word specified by the register selection control datum is switched through with each rising signal edge of the output clock signal.

In a second operating mode of the test data generator according to the invention, the test data word specified by the register selection control datum is switched through to the data bus with each rising and each falling signal edge of the output clock signal.

In another embodiment, the multiplexer switches the test data word through to an internal data bus of a test circuit provided between the test unit and the circuit to be tested.

In this case, in a writing mode of the test circuit, the test data word switched through to the internal data bus of the test circuit is applied, by a data output data driver, to an external data bus connected to the circuit to be tested.

In a reading mode of the test circuit, the test data word switched through to the internal data bus of the test circuit is compared with a data word received from the circuit to be tested via the external data bus and a data input circuit by a data comparison circuit, which outputs an indication signal to the test unit indicating whether the compared data words are identical.

In another embodiment, the test data word present on the data bus can be inverted bit by bit by an inverting circuit.

In a further embodiment, the test data words present on the data bus can be delayed by an adjustable phase difference with respect to the output clock signal by a phase delay circuit.

In still another embodiment of the test data generator according to the invention, the data registers can be initialized by the external test unit via initialization lines.

In an additional embodiment of the test data generator according to the invention, the data registers are contained in a data register array with $2^P$ data registers.

In this case, each register selection control datum has p data bits for the selection of a specific data register.

The register selection data vector is received by the test unit via data control lines with the low clock frequency and is buffer-stored in a register.

In yet another embodiment of the test data generator according to the invention, the number of data control lines is smaller than the bus width of the external data bus.

In a further embodiment of the test data generator according to the invention, the test data words are read cyclically from the data registers.

The test data generator is preferably contained in a test circuit which is provided between the external test unit and the circuit to be tested and which is connected via short lines to the circuit to be tested.

The test data generator according to the invention is preferably used for generating test data patterns for the testing of memory modules which are clocked with a high clock frequency.

An embodiment of the test data generator according to the invention is described below with reference to the accompanying figures for explaining features that are essential to the invention.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein.

DETAILED DESCRIPTION OF THE PRESENT INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
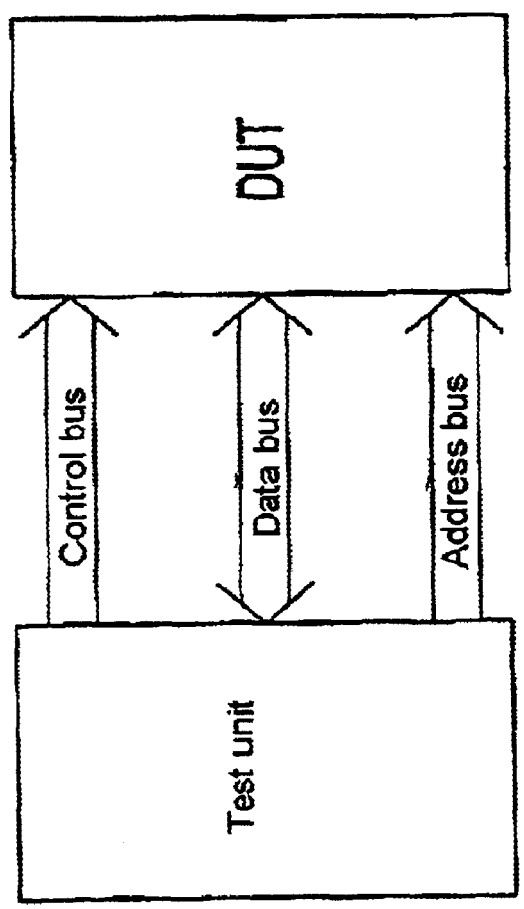
FIG. 1 shows a test arrangement according to the prior art.
Figure 2:
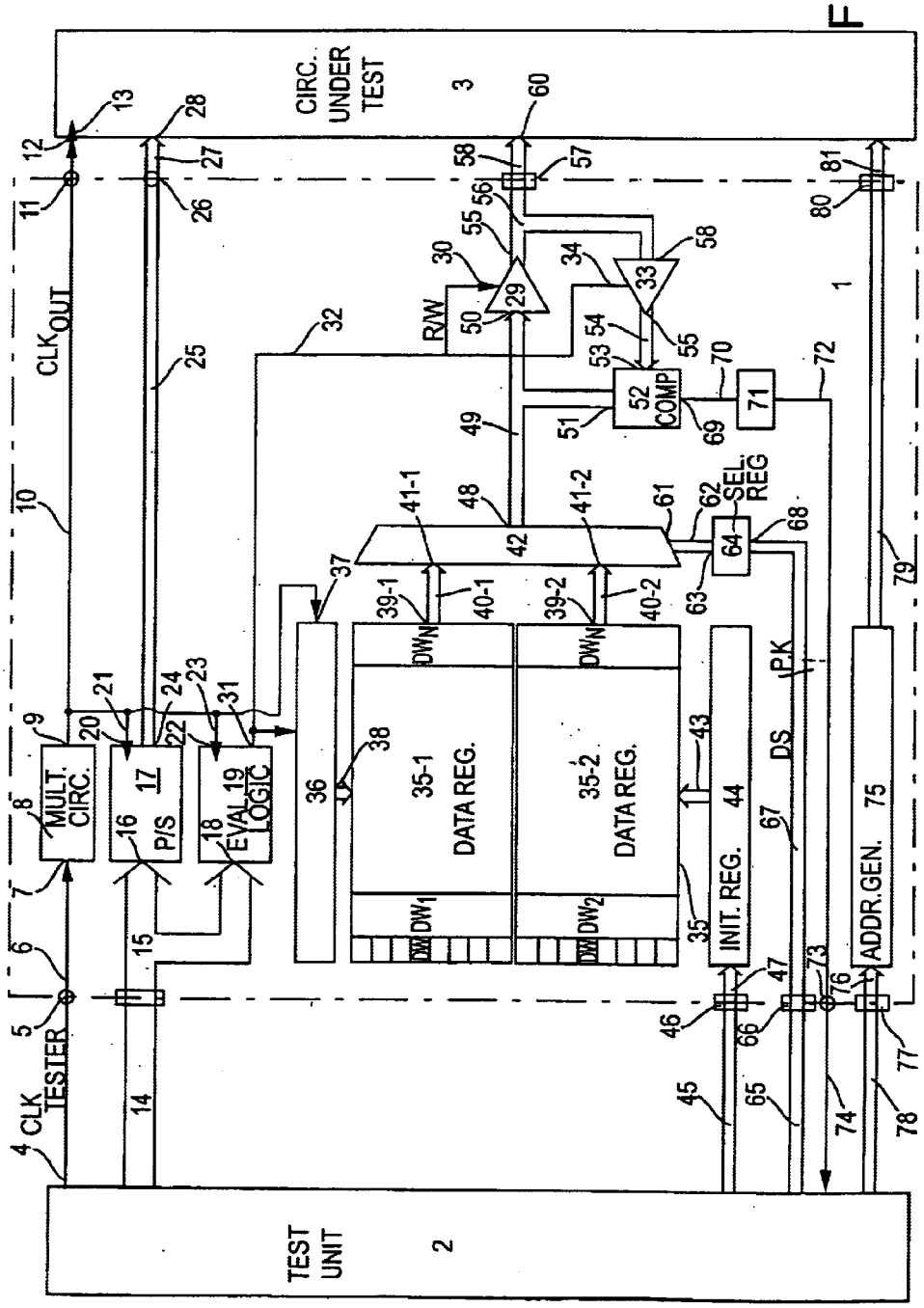
FIG. 2 shows a block diagram of a test arrangement containing a test data generator according to the invention.

As can be seen from FIG. 2, a test circuit 1 is arranged between a conventional test unit 2 and a circuit 3 to be tested. The circuit 3 to be tested is an arbitrary clocked digital circuit, for example a memory module, in particular a DRAM memory. The test unit 2 applies a clock signal with a comparatively low clock frequency of 100 megahertz, for example, to a clock input 5 of the test circuit 1 via a line 4. From the clock input 5, the low-frequency input clock signal of the test circuit 1 passes via an internal clock line 6 to an input 7 of a frequency multiplication circuit 8 for generating an output clock signal with a high clock frequency. For this purpose, the clock frequency multiplication circuit 8 multiplies the clock frequency of the input clock signal by an adjustable clock frequency multiplication factor k and outputs the output clock signal with the increased clock frequency via an output 9 [lacuna] an internal output clock line 10 of the test circuit 1 to a clock output 11 for the test circuit 1. The clock output 11 of the test circuit 1 is connected via an external clock line 12 to a clock input 13 of the circuit 3 to be tested. By way of example, the frequency multiplication circuit increases an input clock frequency of 100 megahertz by a factor 4 and outputs an output clock signal with a clock frequency of 400 megahertz to the circuit 3 to be tested.

The test circuit 1 furthermore receives required control signals for the testing of the circuit 3 from the test unit 2 via a control signal bus 14 at a control input 15. The control signals pass via an internal control signal bus 15 of the test circuit 1 to an input 16 of a parallel/serial converter 17 and to an input 18 of an internal evaluation logic 19. The parallel/serial converter 17 has a clock input 20 and, via a clock line 21, receives the output clock signal from the frequency multiplication circuit 8.

The evaluation logic 19 likewise has a clock input 22 and receives the high-frequency output clock signal via a clock line 23.

The parallel/serial converter 17 clocked with a high clock frequency carries out a parallel/serial conversion of the low-frequency control signals originating from the test unit 2 and outputs high-frequency control signals via an output 20 and internal control lines 25 of the test circuit 1 to an output 26 of the test circuit 1. The control output 26 of the test circuit 1 is connected via an external control bus 27 to control inputs 28 of the circuit 3 to be tested.

The internal evaluation logic 19 of the test circuit 1 generates internal control signals, in particular control signals for the data input and data output drivers, in a manner dependent on the control signals received from the test unit 2. The test circuit 1 contains a data output driver 29 with a control input 30 for receiving a read/write command from the one output 31 of the evaluation logic 19 via a control line 32. The test circuit 1 additionally contains a data input circuit 33 with a control input 34 which is likewise connected to the control line 32.

The test circuit 1 contains a data register array 35 with a plurality of data registers 35-1, 35-2 for controlling a specific number N of data words each comprising a plurality of test data bits. The internal controller 36 has a clock input 37 for receiving the high-frequency clock signal and drives the data register array 35 via control lines 38. The data words DW in the various data registers 35-1, 35-2 are read out via data outputs 39-1, 39-2 and pass via data lines 40-1, 40-2 to inputs 41-1, 41-2 of a multiplexer 42.

In the embodiment illustrated in FIG. 2, two data registers 35-1, 35-2 are contained in the data register array 35. In alternative embodiments, the number of data registers contained in the data register array 35 is a multiple of the value two. The data registers 35-1, 35-2, which each store n data words DW, can be initialized via lines 43 and an initialization register 44. The test data patterns are applied to an input 46 of the test circuit 1 by the test unit 2 via initialization lines 45 and are written to the initialization register 44 via internal initialization lines 47. The initialization of the data registers 35-1, 35-2 is effected before the actual test operation and can be effected with a low clock frequency.

The multiplexer 42 has an output 48 connected via an internal data bus 49 to a data input 50 of the data output driver 29 and to an input 51 of a data comparison circuit 52 of the test circuit 1, which is connected to an output 55 of the data input driver 33 via a further data input 53 and an internal data bus 54.

The data output driver 29 has a data output 55 which is connected to a data output 57 of the test circuit 1 via an internal data bus 56. The internal data bus 56 is furthermore connected to a data input 58 of the data input circuit 33. The data output 57 of the test circuit 1 exchanges data with the circuit 3 to be tested via an external data bus 59 and a data connection 60.

The multiplexer 42 has a control input 61 connected via internal control lines 62 to an output 63 of a register 64 for buffer-storing a register selection data vector. The test unit 2 generates a multi-row register selection control data vector which is applied via lines 65 to a control input 66 of the test circuit 1 and is written to the register 64 via internal control lines 67 and an input 68. The multiplexer 42 switches through the test data words DW, read cyclically from the data registers 35-1, 35-2, to the internal data bus 49 in a manner dependent on a register selection control datum of the multi-row register selection control data vector buffer-stored in the register 64. The register selection control data vector received from the test unit 2 is written to the register 64 with the low clock frequency of the input clock signal and the switched-over test data words are applied to the internal data bus 49 by the multiplexer 42 with the high clock frequency of the output clock signal.

The register selection control data vector has a specific number of register selection control data, the number of register selection control data being equal to the clock frequency multiplication factor k of the frequency multiplication circuit 8. During a clock period of the output clock signal, that test data word DW which is specified by the register selection control datum in the associated row of the register selection data vector is switched through by the multiplexer 42 upon a signal edge of the output clock signal.

The test circuit 1 operates in a writing mode (W) or a reading mode (R) in a manner dependent on the external control signal. In the writing mode of the test circuit 1, the test data word switched through to the internal data bus 49 by the multiplexer 42 is applied to the external data bus 59 by the data output driver 29, said external data bus being connected to the circuit 3 to be tested. In a reading mode of the test circuit 1, the test data word DW switched through to the internal data bus 49 of the test circuit 1 is compared, by the comparison circuit 52, with a data word present on the data bus 54 from the circuit 3 to be tested via the external data bus 59 and the data input circuit 33 and the comparison result is written from the comparison circuit 52 via an output 69 and a line 70 to a register 71, where it is buffer-stored. The comparison result indicates whether or not the read data received from the circuit 3 to be tested correspond to the expected test data words DW from the data registers. If the test circuit 3 to be tested is a memory module, the test data patterns written to the various memory cells must correspond to the test data patterns read out in order that the functionality of the memory cells is ensured. The buffer-stored comparison result is output via lines 72 to an output 73 of the test circuit 1. The output 73 is connected via lines 74 of the external test unit 2.

The test circuit 1 additionally contains an internal address generator 75, which is connected to a control input 77 of the test circuit 1 via control lines 76, the control input 77 being connected to the test unit 2 via control lines 78. The address generator 75 of the test circuit 1 is furthermore connected via the internal address bus 79 to an output 80 of the test circuit 1 which, via an external address bus 81, applies the addresses for the addressing of the memory cells to the circuit 3 to be tested. The internal address generator 75 generates the addresses in a manner dependent on the addressing control signals passed by the test unit 2 via the lines 78.

FIGS. 3a–3d elucidate the method of operation of the test data generator according to the invention.

FIG. 3a shows an output clock signal which is applied by the frequency multiplication circuit 8 to the circuit 3 to be tested via the clock line 12. The frequency multiplication circuit 8 receives the low-frequency input clock signal, which is illustrated in FIG. 3b, from the external test unit 2 via the clock line 4. The clock frequency is multiplied, by the frequency multiplication circuit, by a specific clock frequency multiplication factor k, which is fourth in the example shown, in order to generate the output clock signal illustrated in FIG. 3a. The input clock signal illustrated in FIG. 3b has, for example, a frequency of 100 megahertz, while the output clock signal illustrated in FIG. 3a has a clock frequency of 400 megahertz corresponding to the operating frequency of the memory module 3 to be tested.

At the instant $t_0$, the register selection control data vector DS applied to the test circuit 1 by the test unit 2 via the lines 65 is written to the register 64 for driving the multiplexer 42. The register selection control data vector DS contains a plurality of register selection control data, the number of which is equal to the frequency multiplication factor k. In the example illustrated in FIG. 3, the register selection control data vector DS has four register selection control data, each control datum corresponding to a data register 35-$i$ within the data register array 35. In the embodiment shown in FIG. 2, two data registers 35-1, 35-2 are provided, so that each register selection control datum consists merely of one bit. In the example shown, the register selection control data bit 1 depicts data register 35-2, while the register selection control data bit 0 corresponds to the data register 35-1. With the rising signal edge of the input clock signal at the instant $t_0$, the register selection control data vector DS is accepted into the register 64 and the data words read cyclically from the data registers 35 are subsequently switched through by the multiplexer 42 in accordance with the register selection control data of the register selection control data vector DS.

Figure 3:
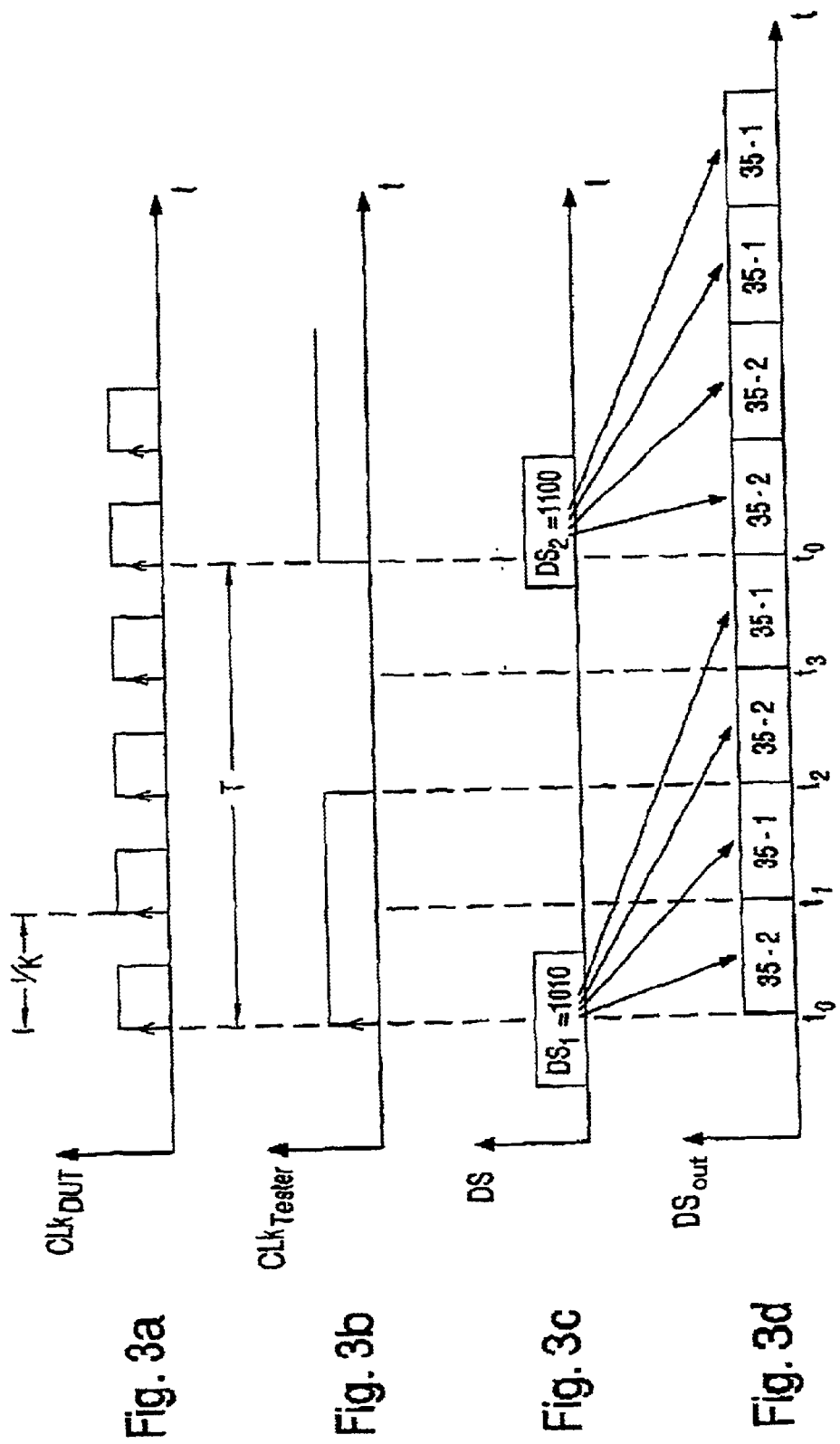
FIGS. 3a–3d show a signal flow diagram for elucidating the method of operation of the test data generator according to the invention.

In the example illustrated in FIG. 3, a first register selection control data vector $DS_1$ has the following values:

$DS_1=1010$

In accordance with the first data bit 1 of the register selection control data vector $DS_1$, firstly a data word from the associated data register 35-2 is switched through to the internal data bus 49 by the multiplexer 42 and then a data word from the other data register 35-1 is switched through in accordance with the next register selection control data bit 0, etc.

After a clock period T of the input clock signal has elapsed, with the next rising signal edge of the input clock signal, the next register selection control data vector is accepted by the test circuit 1 and the operation is repeated. During a clock period T/k of the output clock signal, as is illustrated in FIG. 3a, a test data word is switched through by the multiplexer 42 and applied to the circuit 3 to be tested via the external data bus 59. The circuit 3 to be tested thus receives a high-frequency data signal from the test data generator contained in test circuit 1 in a manner dependent on a register selection control data vector DS applied with a low clock frequency from a conventional test unit 2.

Figure 4:
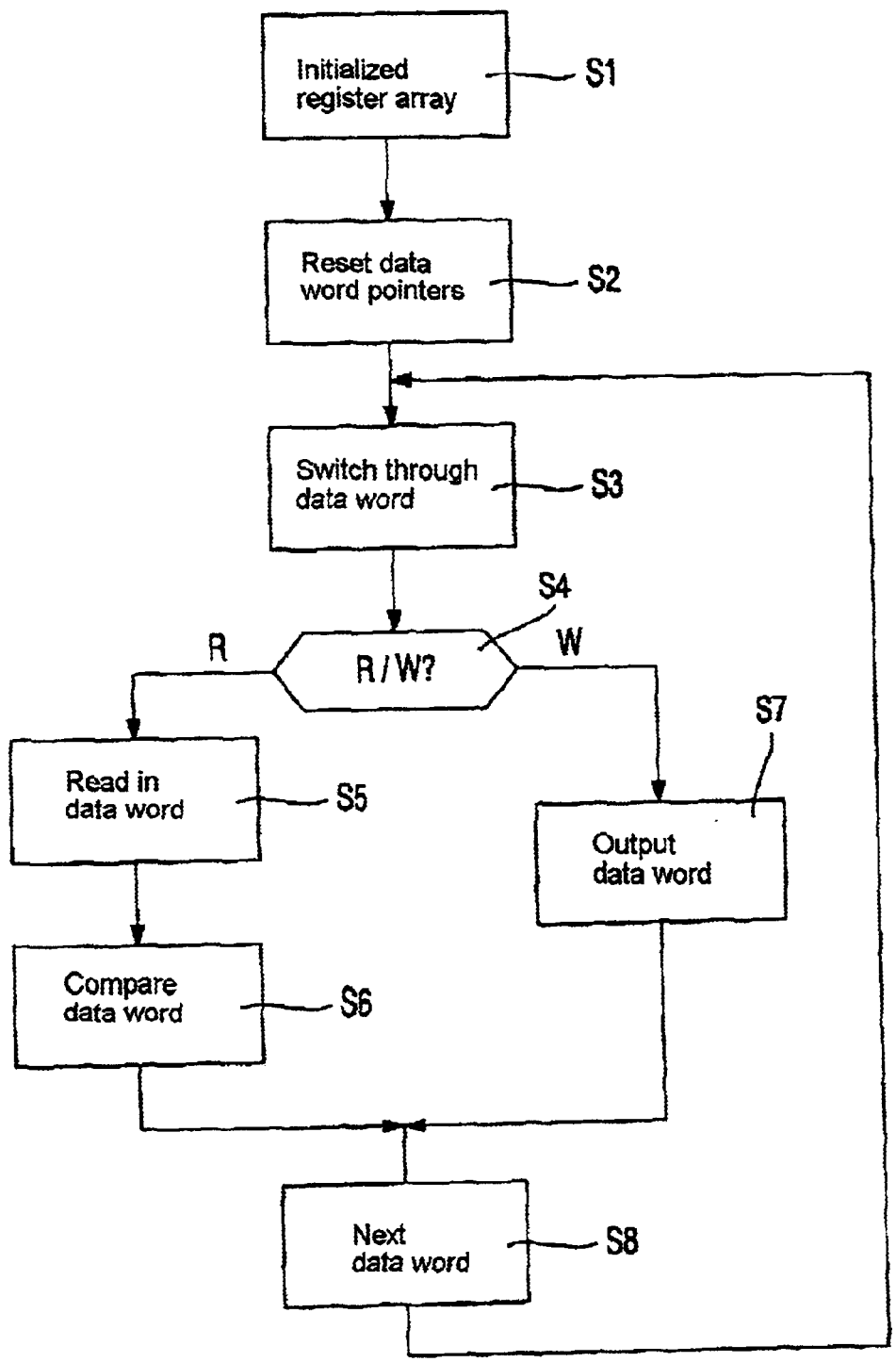
FIG. 4 shows a flow diagram for further elucidating the method of operation of the test data generator according to the invention.

FIG. 4 serves for elucidating the method of operation of the test data generator according to the invention. In a step $S_1$, proceeding from the test unit 2, the register 35 is initialized via the initialization line 45 and the initialization register 44, the test data patterns required for testing the circuit 3 being written to the data registers 35-1, 35-2.

In a step $S_2$, the controller 36 resets a pointer to the various data words DW within the data registers 35-1, 35-2 to the data word $DW_O$.

In a step $s_3$, during a clock period of the output clock signal, a read-out test data word is switched through to the internal bus 49 by the multiplexer 42 in accordance with the register control selection control datum.

In a step $s_4$, in accordance with the read/write command present on the control line 32, either in a step $s_5$ in a reading operating mode R a data word is read in from the circuit 3 to be tested via the external data bus 59 and then compared, in a step $s_6$, with the output test data word by the data comparison circuit 52 or, in a step $s_7$, the switched-through data word is applied via the data output driver 29 to the external data bus 49 and the data input 60 of the circuit 3 to be tested.

In a step $s_8$, the next data word $DW_{1+1}$ is addressed and applied to the input 49 by the multiplexer 42.

In another embodiment of the test circuit 1 illustrated in FIG. 2, there are available for data generation purposes two data registers 35-1, 35-2 with in each case thirty-two storable data words DW each having a bit width of eight bits. During each test cycle of the memory module in the register selection control data vector, the next data register 35-$i$ is output in a burst signal. The length of the burst signal is defined by an internal register that can be coordinated.

In an embodiment, the test circuit 1 can be changed over between a first operating mode for single data rate data generation and a second operating mode for double data rate data generation. In this case, in a first operating mode, test data word specified by the register selection control datum is switched through with each rising signal edge of the output clock signal, as is shown for example in FIG. 3.

In the second operating mode, the test data word DW specified by the register selection control datum is switched through to the data bus with each rising and each falling signal edge of the output clock signal.

The data register array 35 preferably has $2^P$ data registers. The register selection control data of the register selection control data vector DS have p data bits for designating a specific data register 35-$i$. The number of data control lines 65, 67 for directing the register selection control data vector DS to the register 64 is equal to the product of the p data bits and the required frequency multiplication factor k:

$$DS = p \cdot k$$

In a preferred embodiment, the test circuit 1 additionally has a driveable inverting circuit which inverts, bit by bit, the data which are output from the test circuit 1 via the external data bus 59 to the circuit 3 to be tested. In a further particularly preferred embodiment, the test data words present on the data bus 59 are delayed by an adjustable phase difference with respect to the output clock signal by a phase delay circuit contained in the test circuit 1.

The test circuit 1 makes it possible, with relatively little outlay on circuitry, to test S-DRAM memory modules both with a single data transfer rate SDR (SDR: Single Data Rate) and with a double data transfer rate DDR (DDR: Double Data Rate) in accordance with their specification.

The line lengths of the control bus 27, of the external data bus 59 and of the address bus 81 are preferably kept as short as possible. For this purpose, the test circuit 1 according to the invention in a particularly preferred embodiment is integrated into the circuit 3 to be tested. As a result, the test signals are particularly insensitive to interference.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

The present application claims priority of German Patent Application No. 101 15 879.3, filed on Mar. 30, 2001, the disclosure of which is expressly incorporated by reference herein in its entirety.

What is claimed is:

1. A test data generator for generating test data patterns for testing a circuit, comprising:
    (a) a frequency multiplication circuit, configured to increase a low clock frequency of an input clock signal received by a test unit by a predetermined clock frequency multiplication factor, and further configured to generate an output clock signal with a high clock frequency for a circuit to be tested;
    (b) a plurality of data registers, each data register of said plurality of data registers configured to store a predetermined number of read test data words;
    (c) a multi-row set of register selection control data vectors, said set of register selection control data vectors configured to be received by the test unit with the low clock frequency of the input clock signal, each individual register selection control data vector of said multi-row set of register selection control data vectors configured to contain register selection control data at associated positions, wherein a number of register selection control data in a register selection control data vector of said multi-row set of register selection control data vectors is generally equal to the clock frequency multiplication factor;
    (d) at least one multiplexer configured to switch through a test data word read from said data registers with the high clock frequency of the output clock signal to a data bus in a way dependent on a register selection control datum of said multi-position register selection control data vector, such that during a clock period of the output clock signal, the test data word is switched through by the multiplexer when a signal edge of the output clock signal is specified by a register selection control datum of said register selection control data at an associated position of the register selection control data vector.

2. The test data generator according to claim 1, wherein the test data generator is configured to be changed over between a first operating mode for single data rate data generation, and a second operating mode for double data rate data generation.

3. The test data generator according to claim 2, wherein in said first operating mode, the test data word specified by the register selection control datum is switched through with each rising signal edge of the output clock signal.

4. Test data generator according to claim 2, wherein in said second operating mode, the test data word specified by the register selection control datum is switched through to the data bus with each rising and each falling signal edge of the output clock signal.

5. The test data generator according claim 1, wherein said multiplexer switches the test data word DW through to an internal data bus of a test circuit.

6. The test data generator according to claim 5, wherein in a writing mode of said test circuit, the test data word switched through to the internal data bus of said test circuit is applied by a data output driver, to an external data bus connected to the circuit to be tested.

7. The test data generator according to claim 6, wherein in a reading mode of said test circuit, the test data word switched through to the internal data bus of the test circuit is compared with a data word read in from the circuit to be tested via the external data bus and a data input circuit by a data comparison circuit, said data comparison circuit configured to output an indication signal to said test unit, the indication signal configured to indicate whether the compared data words are identical.

8. Test data generator according to claim 5, wherein said test circuit and said circuit are integrated, thereby resulting in small line lengths between said test circuit and said circuit.

9. The test data generator according to claim 1, wherein the test data present on said data bus is configured to be inverted bit by bit, by an inverting circuit.

10. The test data generator according to claim 1, wherein the test data word present on said data bus is configured to be delayed by an adjustable phase difference with respect to the output clock signal by a phase delay circuit.

11. The test data generator according to claim 1, wherein said plurality of data registers are each configured to be initialized by said test unit via initialization lines.

12. The test data generator according to claim 1, wherein said plurality of data registers are configured to be contained in a data register array having $2^p$ data registers.

13. The test data generator according to claim 1, wherein each said register selection control datum has p data bits for the selection of a specific data register.

14. Test data generator according to claim 1, further comprising a register configured to buffer-store said register selection control data vector, wherein said test unit is configured to receive said register selection data vector via data control lines having the low clock frequency.

15. The test data generator according to claim 14, wherein the number of data control lines is less than the bus width of an external data bus.

16. The test data generator according to claim 1, wherein said plurality of data registers are configured to cyclically read the test data words.

17. The test data generator according to claim 1, wherein a pointer to a respective present test data word in said plurality of data registers is configured to be reset by an initialization.

18. The test data generator according claim 1, wherein a pointer to a respective present test data word in said plurality of data registers is configured to be reset by a changeover from writing to reading.

19. The test data generator according to claim 1, wherein a pointer to a respective present test data word in said plurality of data registers is configured to be reset by a changeover from reading to writing.

20. A method for using a test data generator according to claim 1, comprising testing a memory module clocked with a clock frequency of approximately 100 megahertz or higher.

* * * * *